(12) United States Patent
Bando et al.

(10) Patent No.: US 9,530,499 B2
(45) Date of Patent: Dec. 27, 2016

(54) SEMICONDUCTOR MEMORY DEVICE AND INFORMATION PROCESSING DEVICE

(75) Inventors: Yosuke Bando, Yokohama (JP); Atsuhiro Kinoshita, Kamakura (JP); Atsushi Kunimatsu, Funabashi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 267 days.

(21) Appl. No.: 13/557,401

(22) Filed: Jul. 25, 2012

(65) Prior Publication Data

US 2013/0198445 A1 Aug. 1, 2013

(30) Foreign Application Priority Data

Jul. 29, 2011 (JP) ................................ 2011-167042

(51) Int. Cl.
*G11C 15/04* (2006.01)
*G06F 17/30* (2006.01)
*G11C 15/00* (2006.01)

(52) U.S. Cl.
CPC ......... *G11C 15/04* (2013.01); *G06F 17/30864* (2013.01); *G06F 17/30949* (2013.01); *G06F 17/30985* (2013.01); *G11C 15/00* (2013.01)

(58) Field of Classification Search
CPC .................... G06F 2207/025; G06F 17/30982; G06F 17/30985; G06F 17/30097; G06F 17/301; G06F 17/30109; G06F 17/30112
USPC ........................................................ 711/108
See application file for complete search history.

(56) References Cited

U.S. PATENT DOCUMENTS

| 4,646,271 | A | * | 2/1987 | Uchiyama | G11C 15/04 365/189.03 |
|---|---|---|---|---|---|
| 5,946,699 | A | * | 8/1999 | Sawashima et al. | |
| 6,898,661 | B2 | | 5/2005 | Mori et al. | |
| 2003/0223259 | A1 | * | 12/2003 | Roth | G11C 15/04 365/49.17 |
| 2007/0043750 | A1 | * | 2/2007 | Dingle | 707/101 |
| 2008/0140660 | A1 | * | 6/2008 | Masuda et al. | 707/6 |
| 2008/0307343 | A1 | * | 12/2008 | Robert et al. | 715/765 |
| 2009/0006782 | A1 | * | 1/2009 | Buchmann et al. | 711/154 |
| 2009/0030898 | A1 | * | 1/2009 | Otsuki | 707/5 |
| 2009/0164418 | A1 | * | 6/2009 | Pulnikova | 707/3 |
| 2009/0287656 | A1 | * | 11/2009 | Bennett | 707/3 |

(Continued)

FOREIGN PATENT DOCUMENTS

| JP | 2002-279785 | 9/2002 |
|---|---|---|
| JP | 2003-256265 | 9/2003 |

(Continued)

*Primary Examiner* — Midys Rojas
*Assistant Examiner* — Leandro Villanueva
(74) *Attorney, Agent, or Firm* — Oblon, McClelland, Maier & Neustadt, L.L.P.

(57) ABSTRACT

According to one embodiment, a semiconductor memory device includes a memory and a controller. The memory stores data pieces and search information including entries, where each entry is associated with a search key for specifying one data piece and a real address at which the data piece is stored. Upon reception of a first command, the controller, when the first command specifies a search key, outputs one data piece corresponding to one entry which includes the search key, and when the first command specifies one real address, outputs one data piece corresponding to one entry including the real address.

19 Claims, 18 Drawing Sheets

(56) References Cited

U.S. PATENT DOCUMENTS

| | | | |
|---|---|---|---|
| 2010/0005053 A1* | 1/2010 | Estes ................................ 707/1 |
| 2010/0328981 A1* | 12/2010 | Deshpande ............ G11C 15/04 |
| | | 365/49.17 |
| 2011/0246485 A1* | 10/2011 | Rinearson et al. ........... 707/749 |
| 2011/0255322 A1* | 10/2011 | Park .......................... 365/49.17 |
| 2011/0317462 A1* | 12/2011 | Gyllenhammer ...... G11C 15/04 |
| | | 365/49.17 |

FOREIGN PATENT DOCUMENTS

| JP | 2004-282421 | 10/2004 |
|---|---|---|
| JP | 2007-157031 | 6/2007 |

\* cited by examiner

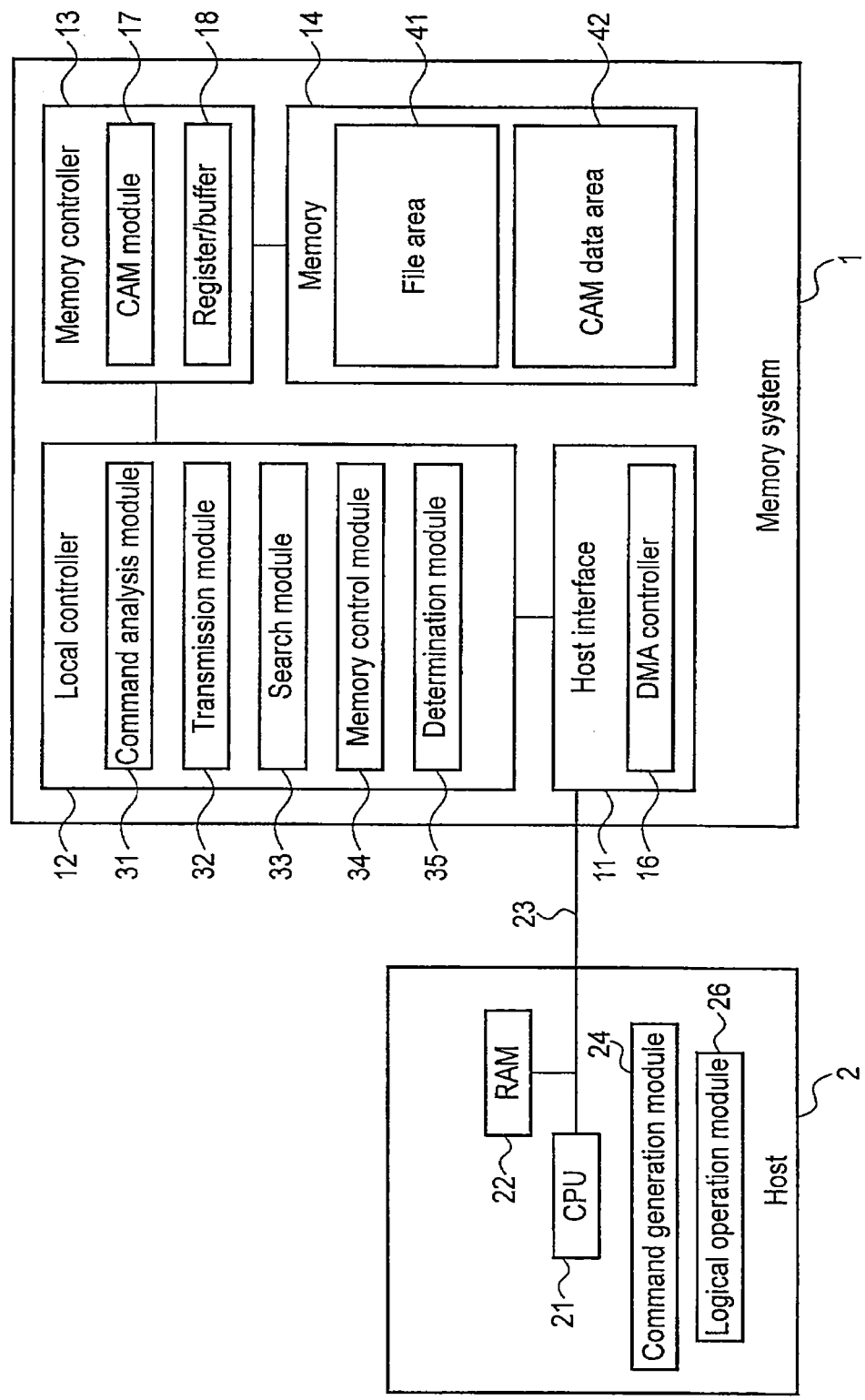
F I G. 1

| Valid/invalid | Entry | Value |
|---|---|---|
| 1 | entry 1 | key 2, key 3, key 4, address A |
| 1 | entry 2 | key 1, key 2, key 3, address B |
| 1 | entry 3 | key 3,              address C |
|   |         |                                |
|   |         |                                |
| 0 | entry n |                                |

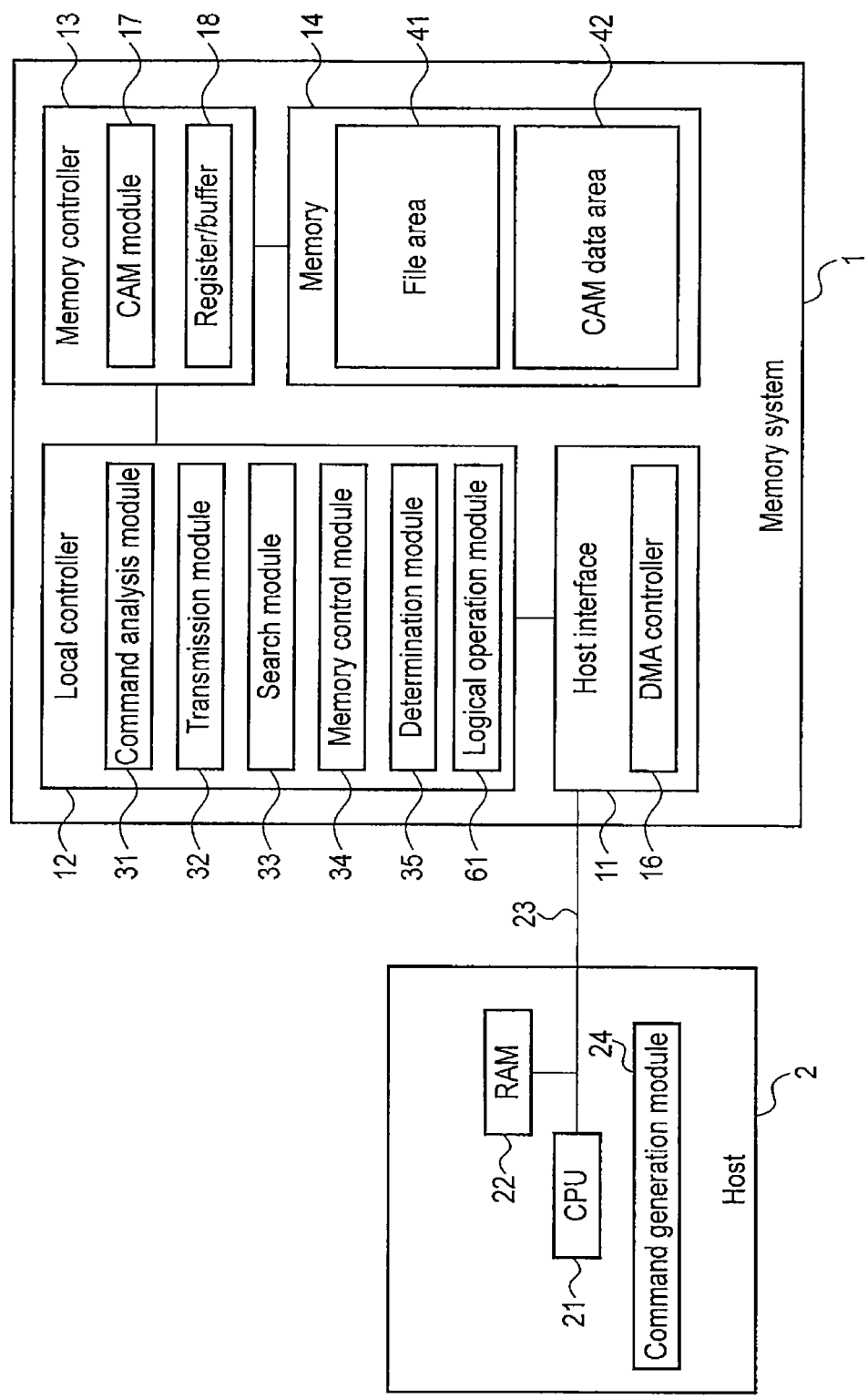
F I G. 5

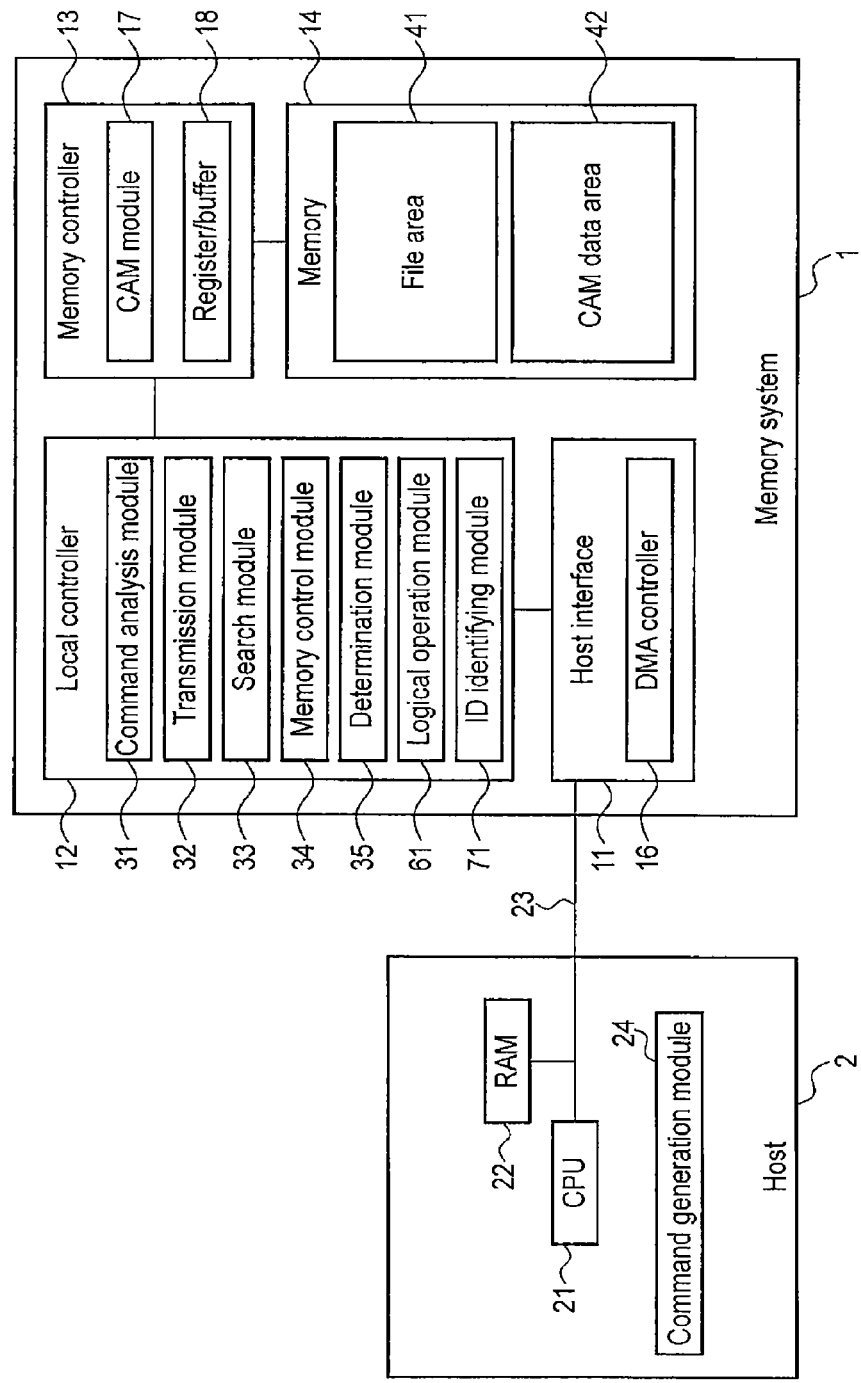
F I G. 9

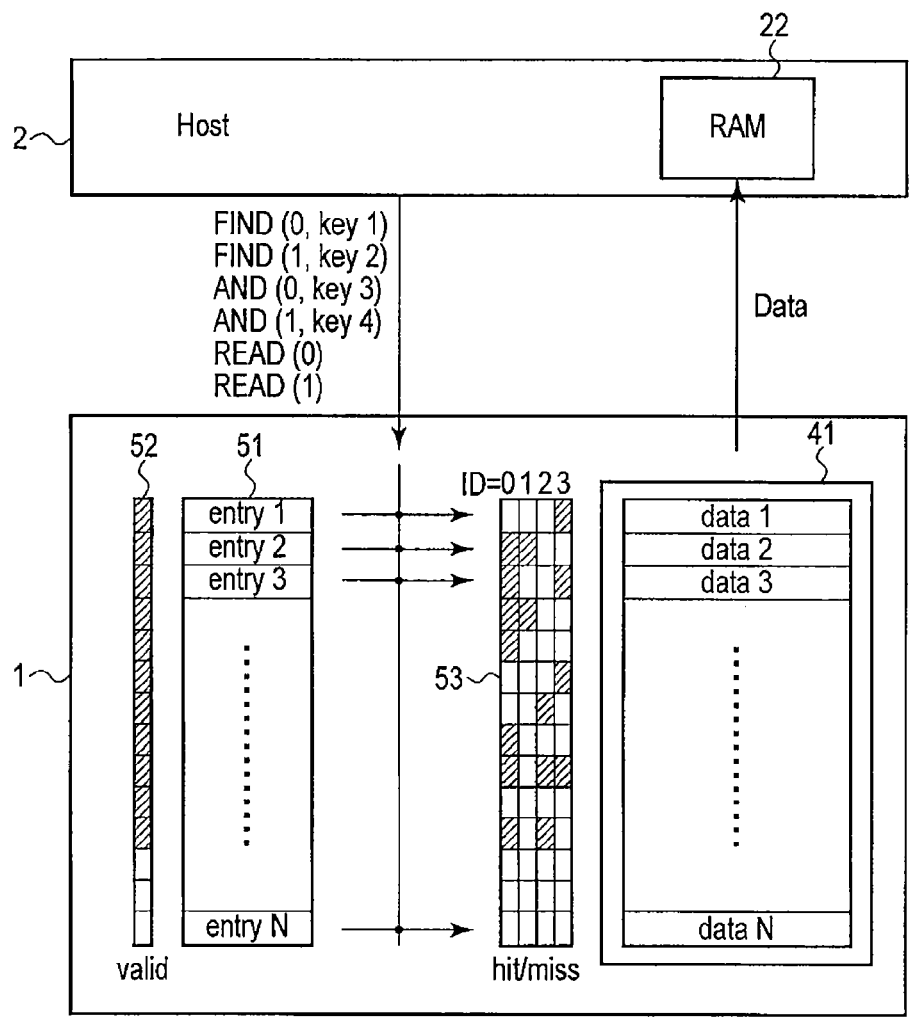
F I G. 10

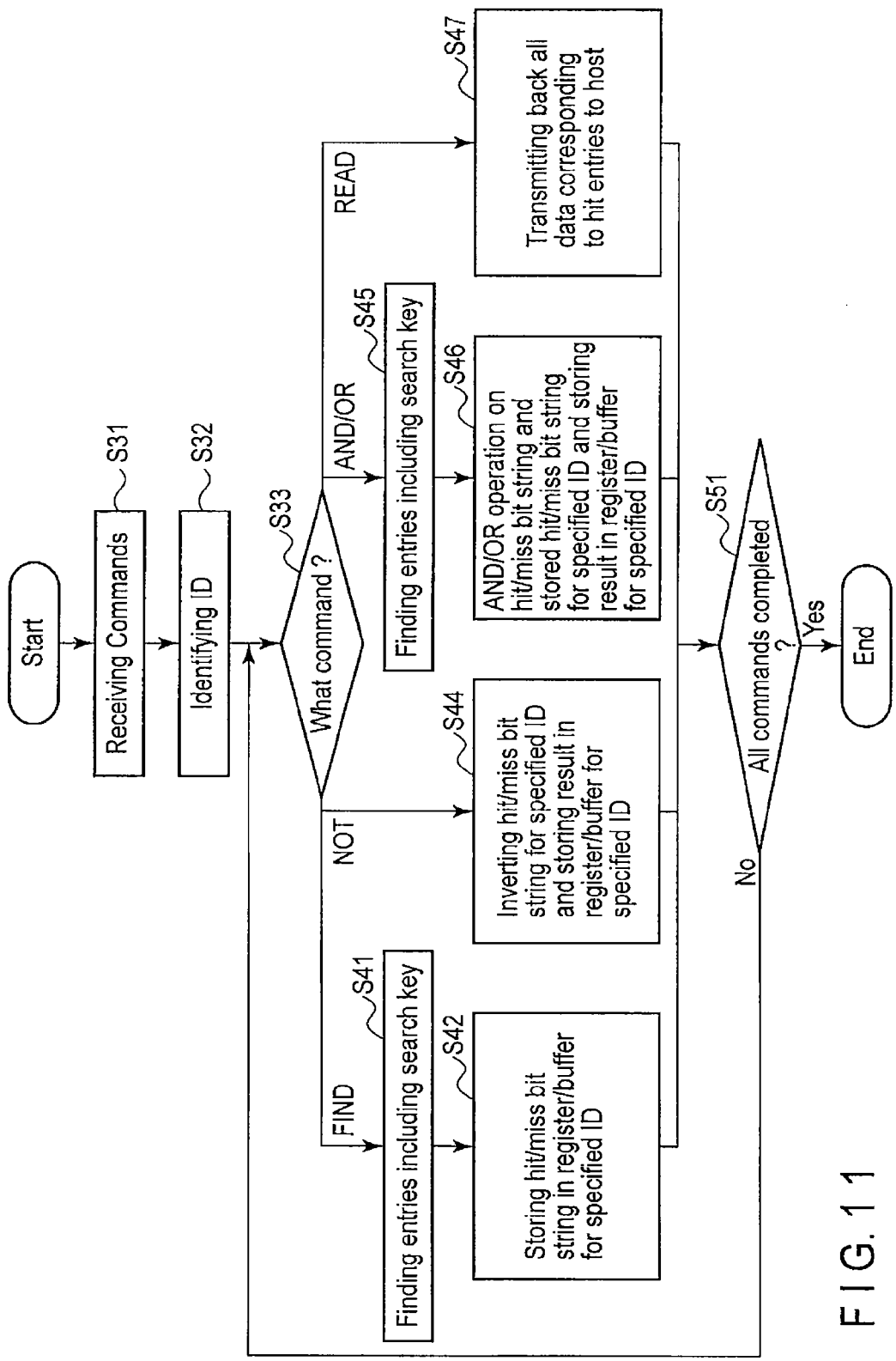
F I G. 11

- GET (key, key_type, target, search_space, summary_types, ranking_method, size, buffer)
  — key : search key
  — key_type : search key type (text, image, audio)
  — target : data type to be found (webpage, file, doc, image, audio, video)
  — search_space : space to be searched (web, disk, memory)
  — summary_types : list of types of summary of search results
  — ranking_method : basis on which entries are ranked
  — size : size of buffer to store results
  — buffer : address of buffer to store results

FIG. 12

- GET (key, key_type, target, search_space, summary_types, ranking_method, head, number)
  — head : highest rank
  — number : number to be received

FIG. 13

|  | key | key_type | target | search_space | summary_types | ranking_method |
|---|---|---|---|---|---|---|
| picture retrieval with text | "toshiba" | text | image | web | [thumbnail] | page_rank |
| searching disk with text | "toshiba" | text | file | disk "/home/" | [file_size, modified_date] | new_to_old |
| DMA | >=0x0123abcd | address | binary_data | memory | null | address |

F I G. 14

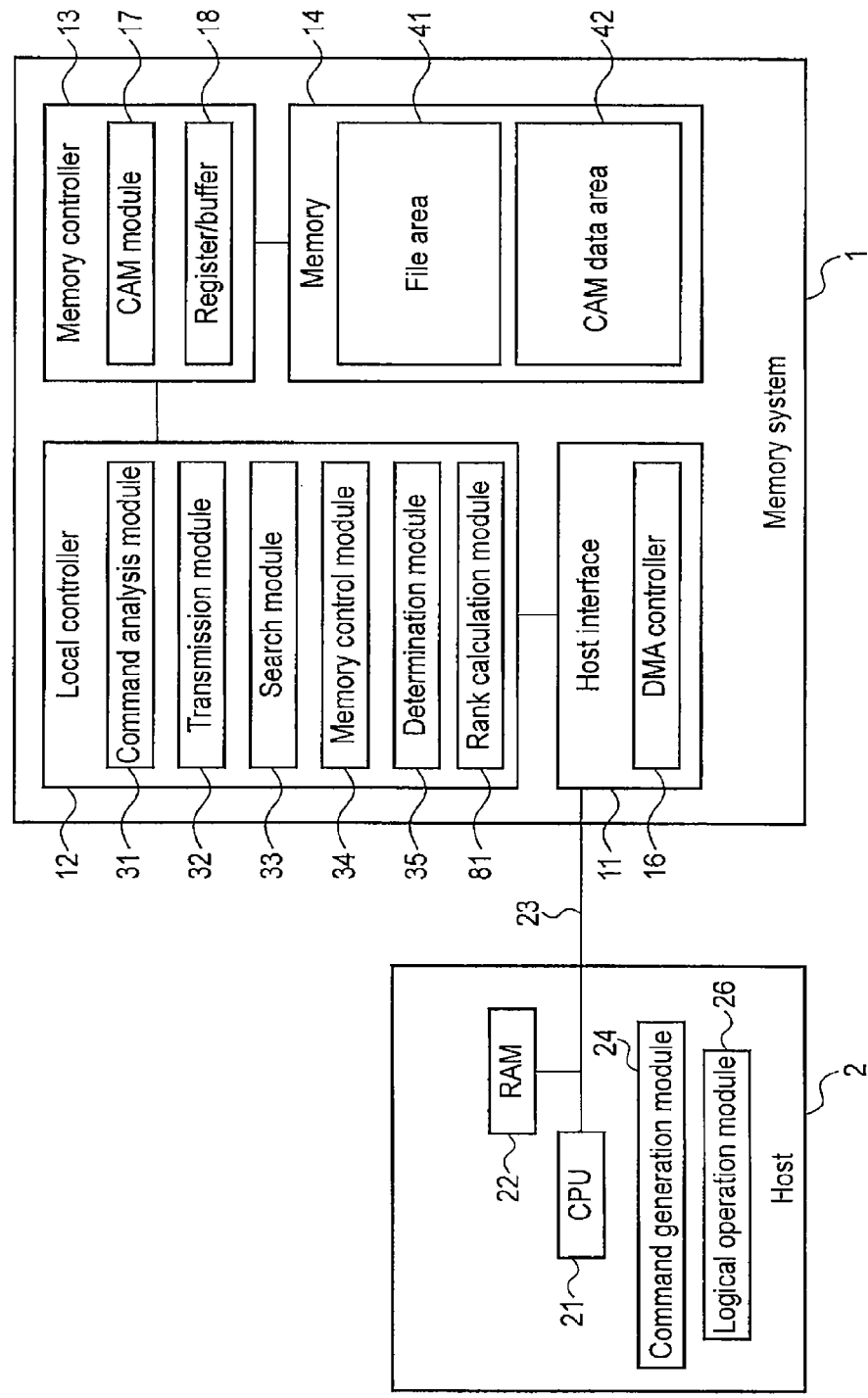
F I G. 15

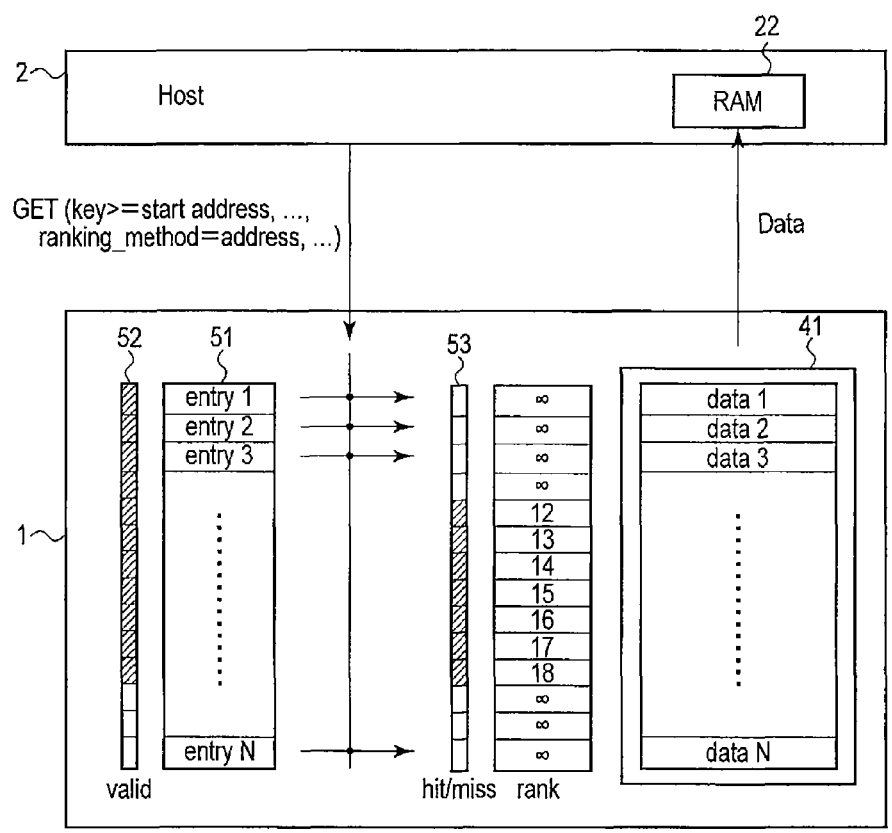
F I G. 17

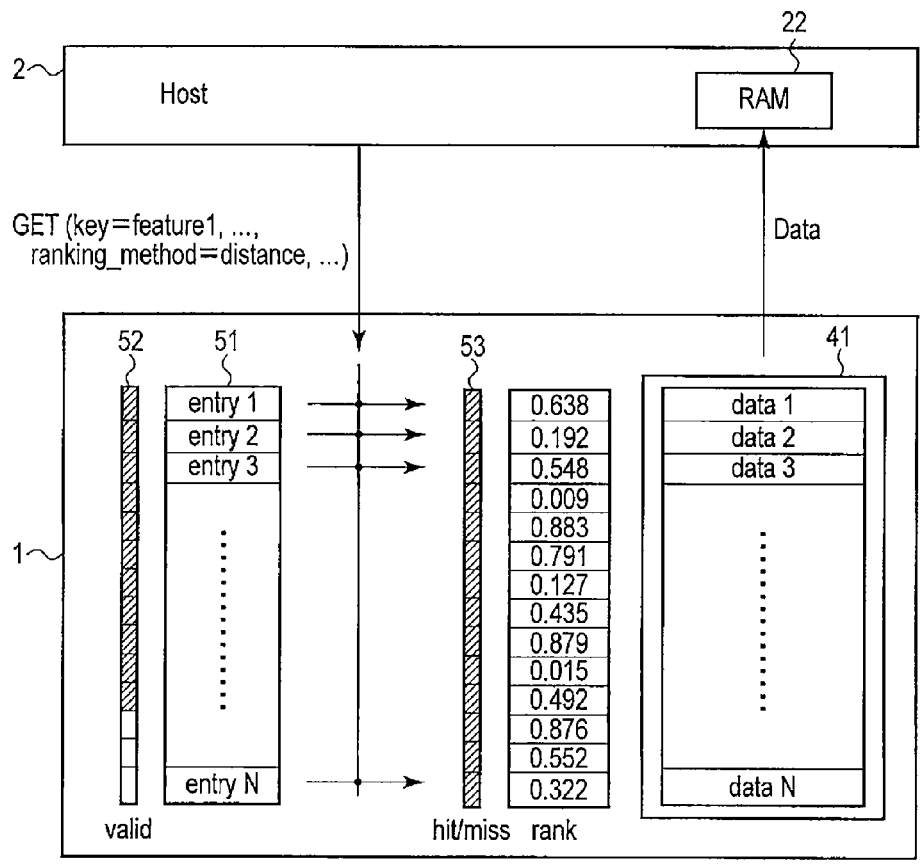

FIG. 19

- PUT (key, key_type, target, search_space, ranking_method, head, size, buffer)
  — key : search key
  — key_type : search key type (text, image, audio)
  — target : data type to be found (webpage, file, doc, image, audio, video)
  — search_space : space to store (disk, folder, memory)
  — ranking_method : basis on which entries are ranked
  — head : start entry
  — size : size of buffer to store to-be-written value
  — buffer : address of buffer to store to-be-written value

FIG. 20

- ADD_KEY (key, key_type, target, search_space, ranking_method, head, number, key_to_add, key_to_add_type)
  — key_to_add : key to be added
  — key_to_add_type : type of to-be-added key

SEMICONDUCTOR MEMORY DEVICE AND INFORMATION PROCESSING DEVICE

CROSS-REFERENCE TO RELATED APPLICATIONS

This application is based upon and claims the benefit of priority from Japanese Patent Application No. 2011-167042, filed Jul. 29, 2011, the entire contents of which are incorporated herein by reference.

FIELD

Embodiments described herein relate generally to a semiconductor memory device and information processing unit.

BACKGROUND

A content addressable memory is known. To a memory other than the content addressable memory, a host specifies data in it with an address of an area in the memory which stores it. In contrast, the host specifies metadata or a key associated with data in the content addressable memory to specify it. Data to be read can be identified through logical operation to metadata pieces. Such data reading involving the logical operation to metadata pieces requires heavy processing.

BRIEF DESCRIPTION OF THE DRAWINGS

FIG. 1 illustrates a block diagram of a memory system according to a first embodiment.
FIG. 5 illustrates a block diagram of a memory system according to a second embodiment.
FIG. 9 illustrates a block diagram of a memory system according to a third embodiment.
FIG. 10 illustrates an operation of the memory system according to the third embodiment.
FIG. 11 illustrates a flowchart for the operation of the memory system according to the third embodiment.
FIGS. 12 to 14 illustrate commands supported by a memory system according to a fourth embodiment.
FIG. 15 illustrates a block diagram of a memory system according to a fourth embodiment.
FIGS. 16 to 19 illustrate operations of the memory system according to the fourth embodiment.
FIG. 20 illustrates commands supported by the memory system according to the fourth embodiment.

DETAILED DESCRIPTION

Figures 2, 3:
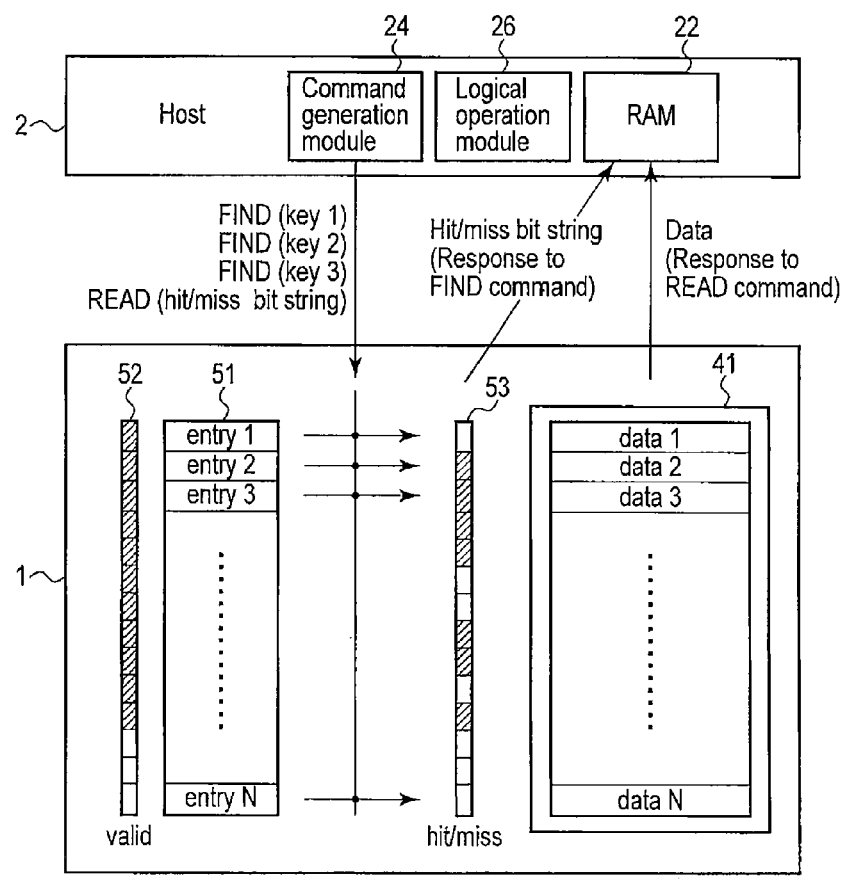
FIG. 2 illustrates a format of a metadata table.
FIG. 3 illustrates an operation of the memory system according to the first embodiment.

In general, according to one embodiment, a semiconductor memory device includes a memory and a controller. The memory stores data pieces and search information including entries, where each entry is associated with a search key for specifying one data piece and a real address at which the data piece is stored. Upon reception of a first command, the controller, when the first command specifies a search key, outputs one data piece corresponding to one entry which includes the search key, and when the first command specifies one real address, outputs one data piece corresponding to one entry including the real address.

Before describing embodiments, a content addressable memory will be briefly described. A host which accesses the content addressable memory attaches metadata, or a key or keys, to data in order to write the data in the memory. The one or more keys may include an element or elements of a variety of types, such as a word included in the data to be written (write data) and an extension of a file name. The host generates the key to be attached to the write data by any known method. The host uses a PUT command to write the data to the content addressable memory, for example. It supplies the write data and the keys to the content addressable memory along with the PUT command. The content addressable memory stores a metadata table as well as the write data. The metadata table is a set of various data regarding the keys, has an entry for each data such as a file, and includes two or more such entries. Upon reception of the write data and keys, a controller which controls the memory stores the write data in a free area in the memory, and writes the keys and the address for identifying the area which stores the write data associated with the keys in a free entry in the metadata table. Each entry is provided with information indicative of its validity, and invalid entries are searched for a free entry.

The host which wishes to read data from the content addressable memory uses a key or keys input by a user of the host to specify the data, for example. A GET command may be used to read the data. The host supplies the one or more keys to the content addressable memory with the GET command. Upon reception of the keys to be found, the content addressable memory searches for entries which include the search keys. It then transmits to the host all data stored in the addresses described in all found entries.

The host which wishes to delete data in the content addressable memory uses a DELETE command. It supplies a key or keys to the content addressable memory with the DELETE command. Upon reception of the DELETE command, the content addressable memory searches for entries which include the search key. The content addressable memory invalidates the found entries.

The user may wish the content addressable memory to execute an advanced search using logical operation to the search keys instead of directly using only one search key. More specifically, a search using multiple search keys is possible. Such a search involves the memory first finding entries including the first search key, transmission of data corresponding to each of all found entries to the host. The memory then finds entries including the second search key and transmits data corresponding to each of all found entries. Thus, the host receives the data associated with all search keys. It then performs the AND operation to find data hits with respect to all search keys out of the received data, for example. The AND operation here refers to a set operation to extract the common set between the data set for the first search key and that for the second search key. Thus, the host extracts data including all search keys.

For such logical operation involving the AND operation, the host and memory require a lot of processing. Moreover, even data which will be unnecessary as a result of the logical operation by the host is also transferred to the host from the memory. Furthermore, the data corresponding to the hit entries in the memory is transferred to the host from the memory in succession over a long period, which may delay other processing in the host during the period. Thus, an improvement is desired in processing load and efficiency. The description above has covered the AND operation; however, it also equally applies to other logical operations such as the OR operation. The OR operation here refers to a set operation to extract the union of a data set for the first search key and that for the second search key. The same holds true for the NOT operation, which will be described later and generates the complementary set of data for the search keys.

Embodiments configured based on such findings will now be described with reference to the drawings. Note that components which have substantially identical functions and configurations are labeled with the same reference numbers in the following description, and a repeated description will be given only when required. Any embodiment below merely illustrates devices and methods for carrying out the technical idea, and the technical idea of the embodiments is not limited to the following example. The technical idea of the embodiments may be variously changed in accordance with the scope of the claims.

Any functional block, or module, can be implemented as hardware, computer software, or a combination of both. In order to clearly illustrate this interchangeability of hardware and software, a description will be given in terms of their general functionality. Whether such functionality is implemented as hardware or software is arbitrary. Those skilled in the art may implement the functional blocks in varying ways for each particular application, but any implementation approach is included in the scope of the embodiments. Furthermore, it is not essential that the functional blocks are distinguished from one another as described below in specific examples. For example, some of the functions may be performed by functional blocks different from those illustrated below. Moreover, the illustrated functional block may be divided into functional sub-blocks. The embodiments are not limited by the specification of the particular functional blocks.

First Embodiment

FIG. 1 illustrates a block diagram of a memory system, or a semiconductor memory device or an information processing unit, according to the first embodiment. As shown in FIG. 1, a memory system 1 communicates with a host device 2, which may be referred to as a host 2 hereinafter. The host 2 may include a central processing unit (CPU) 21 and a random access memory (RAM) 22. The RAM may be a dynamic random access memory (DRAM). The CPU 21 is coupled to the RAM 22 by a bus 23. The CPU 21 performs predetermined processing based on a control program loaded from a storage such as a Read-only Memory (ROM) onto the RAM 22. The processing is performed by modules implemented by the CPU 21 and its control program. The modules include at least a command generation module 24 and a logical operation module 26. The figure illustrates these modules as being independent of the CPU 21 and a RAM in the host 2 for simplicity.

The memory system 1 may include a processor, a RAM, and a ROM as a hardware configuration. A control program, or commands stored in the ROM is/are loaded to the RAM during operation. The processor performs predetermined processing in accordance with the program. Functional blocks other than the memory in the memory system 1 described below are implemented by a processor in accordance with the control program in the RAM. Alternatively, a functional block may be implemented by its own dedicated hardware such as a chip.

The memory system 1 includes a host interface 11, a local controller 12, a memory controller 13, and a memory 14. The host interface 11 is coupled by a bus 23 to the CPU 21, or to an interface module in the host 2 implemented by the CPU 21 and a program. The host interface 11 includes hardware required to allow the memory system 1 to interface with the host 2. The host interface 11 defines various protocols required for the memory system 1 and host 2 to communicate with each other, and includes a command set of various types which is recognizable by both the host interface 11 and host 2, or the interface module in the host 2.

The host interface 11 includes a direct memory access (DMA) controller 16. The DMA controller 16 manages transmission of data between certain two areas without a processor. The DMA controller 16 identifies data by specifying it with a real address. The real address refers to a physical address or a logical address.

The local controller 12 is communicatively coupled to the host interface 11. The local controller 12 analyzes commands received from the host 2, and generates various tasks for performing processing instructed by the commands. The local controller 12 and host interface 11 support the PUT command, GET command and DELETE command described above as well as all commands, which will be described below. The local controller 12 is communicatively coupled to the memory controller 13. The local controller 12 may include a command analysis module 31, a transmission module 32, a search module 33, a memory control module 34, and determination module 35. Each module is responsible for execution of corresponding specific processing of the local controller 12, which will be described below.

The memory controller 13 receives a task which involves the memory 14 from the local controller 12, and transmits instructions for performing the task to the memory 14. Specifically, the memory controller 13 writes, reads and erases specific data to, from and in the memory 14 with commands for memory 14 and in accordance with specified steps.

The memory controller 13 includes a content addressable memory (CAM) module 17. The CAM module 17 may perform to the memory 14 writing, reading and erasure of data to actually execute the commands using search keys received from the host. The CAM module 17 may be implemented as dedicated hardware or through the processor in the memory system 1 following a control program on the RAM in the memory system 1. The memory controller 13 also includes a register/buffer 18. The register/buffer 18 temporarily stores data being processed by the memory controller 13.

The memory 14 is communicatively coupled to the memory controller 13. The memory 14 is implemented as any of nonvolatile memories of various types such as a NAND flash memory. The NAND flash memory writes and reads data in units of pages. A page includes a memory space consisting of a set of serially-connected memory cells, and is assigned a unique physical address. The NAND flash memory erases data in units of blocks. A block includes pages with serial physical addresses. A memory cell includes a so-called stacked-gate-structured metal oxide semiconductor field effect transistor (MOSFET). A cell transistor assumes a threshold voltage that varies in accordance with the number of electrons in its floating gate electrode, and stores information in accordance with the difference in the threshold voltage. The memory 14 also includes a buffer.

For a case of the memory 14 being the NAND flash memory, it may be a single level cell (SLC) type, or a multi level cell (MLC) type. The SLC type stores one-bit data in a cell. The MLC type stores two-or-more bit data in a cell. The memory 14 is configured to store and read one-or-more bit data in a cell. The memory 14 may include multiple memory chips rather than one. A chip or an area in the chip may be dedicated for the SLC type or MLC type.

The memory 14 includes a file area 41 storing main data such as a file, and a CAM data area 42 storing metadata. The CAM data area 42 stores a metadata table used for a content addressable memory function. These areas may be implemented by some or all available dedicated blocks in the memory 14.

For a case of the memory 14 being the NAND flash memory, there are restrictions such as the prohibition of overwriting written data. Therefore, translation of addresses may be performed and managed in order to perform instructions received from the local controller 12. Specifically, the memory controller 13 creates and uses a translation table between a logical address assigned to data received from the local controller 12 and a physical address for an area in the file area storing this data. The translation table may be known as a logical-physical translation table by a person skilled in the art. Processing corresponding to overwriting to the memory 41 is indirectly executed by the memory controller 13 using the translation table.

The metadata table may have a format as illustrated in FIG. 2. As shown in FIG. 2, the metadata table includes multiple entries. Each entry is associated with separate data. An entry includes at least a key or keys associated with data corresponding to this entry, an address for identifying an area in the file area 41 storing this data, and a valid/invalid indication of the entry. A key can have various features. They may include a word in the data, the file name of the data, the file extension of the data, and the rewriting frequency. A key or keys may be generated for each file. In a case where the memory 14 is a NAND flash memory and a file is stored over multiple pages, the key or keys generated for the file may be assigned to each page data of multiple page data stored in the multiple pages. In such a case, each page data corresponds to each entry, and the same key or keys may be assigned over the entries corresponding to multiple page data pieces included in the same file and each address in each entry may be the page address of each page data.

Figure 4:
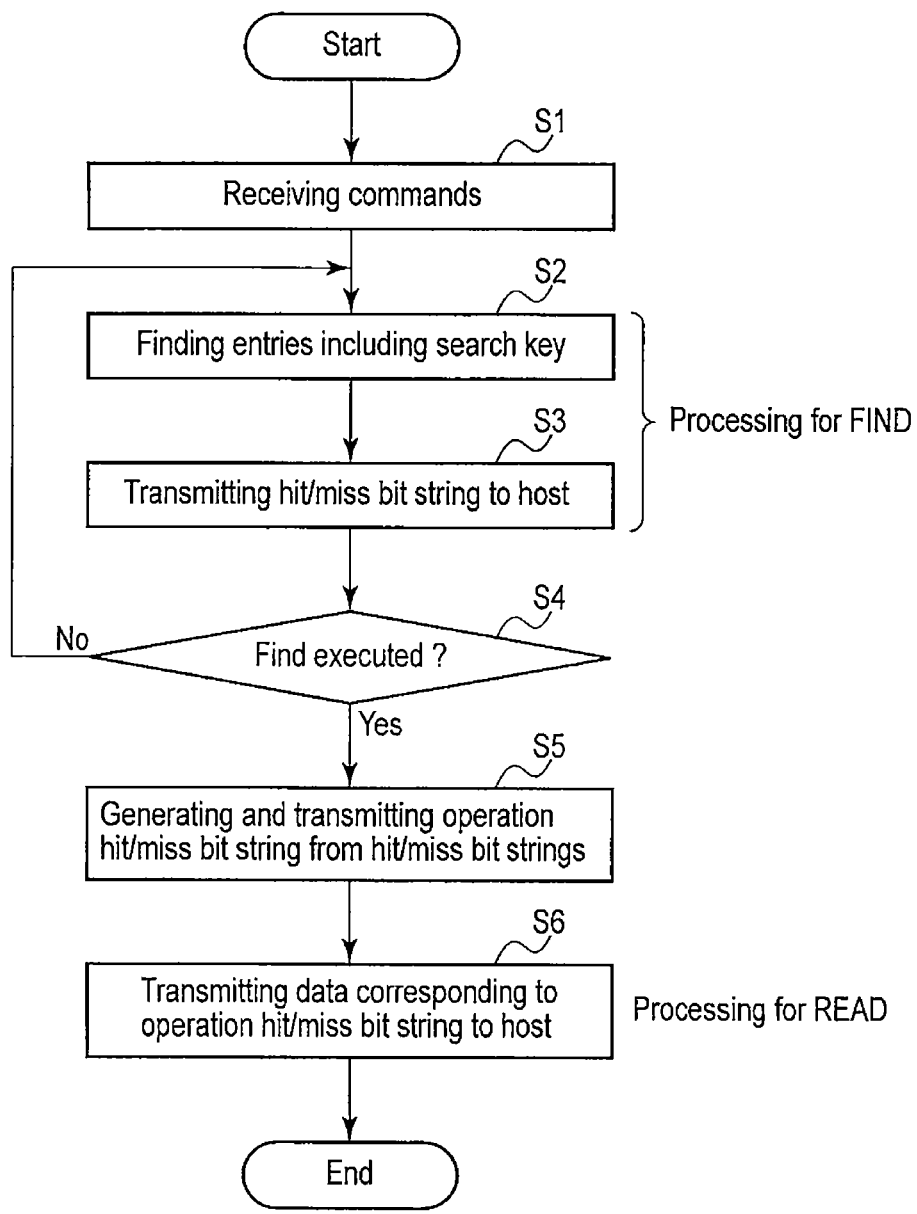
FIG. 4 illustrates a flowchart for the operation of the memory system according to the first embodiment.

Referring to FIGS. 3 and 4, an operation of the memory system 1 will now be described. The functional blocks will be further described in detail as well. FIG. 3 schematically illustrates an operation of the memory system according to the first embodiment. FIG. 4 schematically illustrates an operation of the memory system according to the first embodiment, and shows a flowchart corresponding to FIG. 3. As shown in FIGS. 3 and 4, assume that the host 2 has received a request to search data which includes key1, key2, and key3 as search keys. The request corresponds to execution of the command GET (key1&key2&key3). In response to such a request, the command generation module 24 in the host 2 translates the request into different commands, or generates commands, to implement it. Specifically, it breaks down the request into a command FIND (key1&key2&key3) and a command READ (hit/miss bit string). The FIND command instructs output of a set of bits for all valid entries, where each bit indicates whether a corresponding entry includes the search keys specified in the command. The command READ (hit/miss bit string) instructs transmission of data corresponding to the entries specified by the bit string in the READ command to the host 2, or data in the file area 41 in areas specified by the respective addresses described in the respective entries). These two kinds of commands will be described in full detail later.

The command generation module 24 further breaks down the FIND (key1&key2&key3) command into separate FIND commands for respective search keys. In the ongoing context, it breaks down the command into the command FIND (key1), the command FIND (key2), and the command FIND (key3). The obtained commands are transmitted one after another to the memory system 1 under control by the control module in the host 2. The memory system 1 in the local controller 12 receives the commands FIND (key1), FIND (key2), and FIND (key3) at the host interface 11 (step S1). The FIND (key1&key2&key3) command may also be received by the local controller 12, or the command analysis module 31, and then broken down into the commands FIND (key1), FIND (key2), and FIND (key3). The host interface 11 and local controller 12 support the FIND command and READ command.

The local controller 12, or the search module 33 or memory control module 34, executes the first FIND command via processing to the memory controller 13. Specifically, when the memory controller 13 receives the FIND command (key1) via the CAM module 17, it accesses the metadata table 51 in the CAM data area 42 to find valid entries including the search key key1. It then generates the bit string which specifies the found entry or entries (step S2). Each bit from the bit string corresponds to one entry, and indicates the hit/miss of the corresponding entry. The bit string is referred to as a hit/miss bit string 53.

Generation of the hit/mistake bit string 53 may involve loading of the entries in the metadata table 51 to the CAM module 17 one after another and comparing of the description in each entry with the search key (key1) to find entries including the search key. To this end, the CAM module 17 may load the entries to the RAM in the memory system 1 via the memory controller 13 one after another, and compare the description in the loaded entries with the search key. It then stores information for specifying the respective hit entries one after another in the register/buffer 18 to generate the hit/miss bit string 53. Component 52 in the figure is a valid/invalid indicator for each entry.

The CAM function may be realized only by the memory 14. Specifically, the memory 14 may include a search key comparison circuit for comparing all entries in the CAM data area 42, and when the memory 14 receives a search key, it will output comparison results on whether it is included, i.e., the hit/miss bit string. With such a memory 14, the CAM module 17 only needs to specify the search keys to the memory 14 and store a returned hit/miss bit string in the register/buffer 18. The CAM module 17 then transmits the hit/miss bit string 53 to the host 2 via the local controller 12 (or transmission module 32) and host interface 11 (step S3). The host 2 may store the received hit/miss bit string 53 for the first search key key1 on the RAM 22.

The local controller 12 (or determination module 35) then determines whether all FIND commands have been executed (step S4). With an unexecuted FIND command, steps S2 and S3 will be repeated until there is no unexecuted command. In the ongoing context, the CAM module 17 executes the second FIND command, or the FIND command for the search key key2, similarly to the first FIND command. As a result of the execution, the hit/miss bit string 53 for the search key key2 is generated and then stored in the host 1. Similarly, the hit/miss bit string 53 for the search key key3 is generated and then stored in the host 2.

Once execution of the FIND commands for all search keys is completed, the processing shifts to step S5. In step S5, the logical operation module 26 uses the RAM 22 as a work memory to calculate AND of the hit/miss bit strings 53 for the search keys key1, key2, and key3. As a result of the AND processing, an operation hit/miss bit string is obtained. It includes a bit string specifying entries in the metadata table which include all search keys key1, key2, and key3.

The command generation module 24 then generates a command READ (hit/miss bit string), which is transmitted to the memory system 1 by the host 2 (step S5). The READ command specifies the operation hit/miss bit string. Upon reception of such a command, the local controller 12 (or memory control module 34) transmits to the host 2 data in the file area 41 in the areas identified by the corresponding entries specified by the operation hit/miss bit string through the memory controller 13 (step S6). Specifically, the READ command received by the local controller 12 via the host interface 11 is analyzed, and the memory controller 13 reads addresses corresponding to respective entries in the CAM data area 42 one after another in accordance with the result of the analysis. The memory controller 13 then reads from the areas in the file area 41 data corresponding to the addresses in the read entries and transfers it to the host 2 via the local controller 12 and the host interface 11 in succession.

The description so far has covered an example of the search keys connected by AND; however, the processing for the case of OR is similar. Specifically, in the OR search, the host 2 executes the OR operation on the hit/miss bit strings for the OR-target search keys to generate the operation hit/miss bit string.

As described, according to the first embodiment the data output which involves the logical operation is executed as output of the hit/miss bit string indicating entries including the search keys from the host 2, the logical operation to bit strings by the host 2, and output of data corresponding to the operation hit/miss bit string. With such a method, the data itself including only the search keys is not output from the memory system 1; instead, only the bit strings which specify the entries including the search keys, and the data reflecting the logical operation to the search keys is output. This decreases the amount of transmitted data and allows for efficient data output for the search keys as a whole.

Second Embodiment

The second embodiment concerns a search involving the logical operation to the search keys as in the first embodiment.

Figure 6:
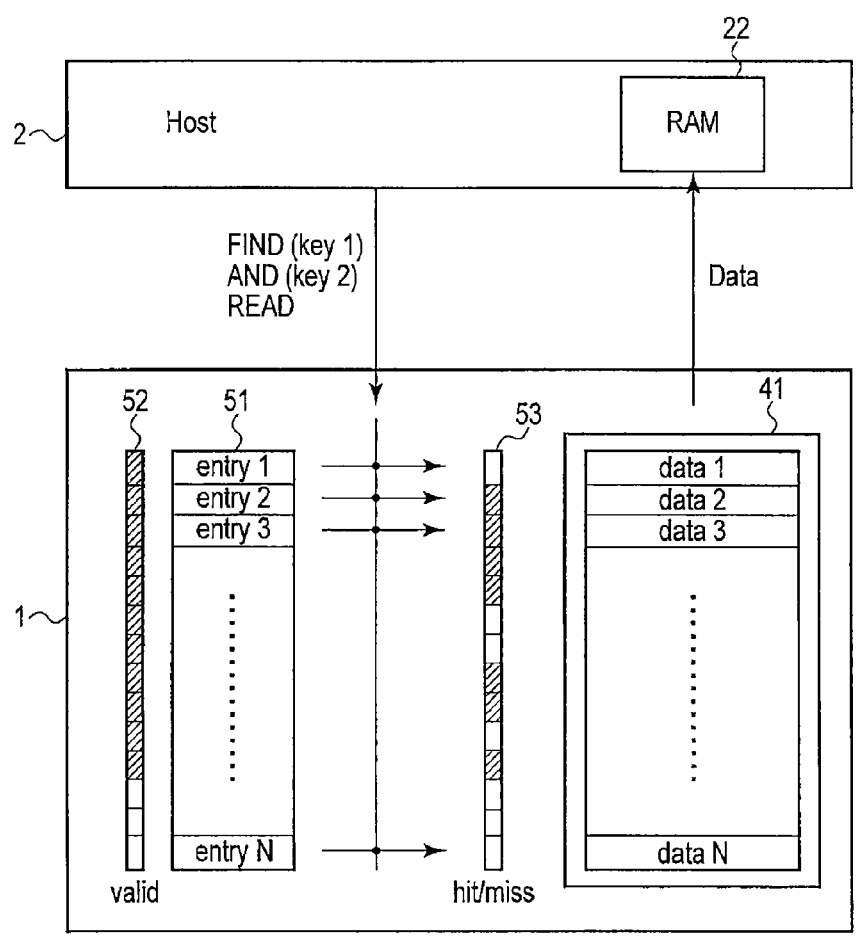
FIG. 6 illustrates an operation of the memory system according to the second embodiment.
Figure 7:
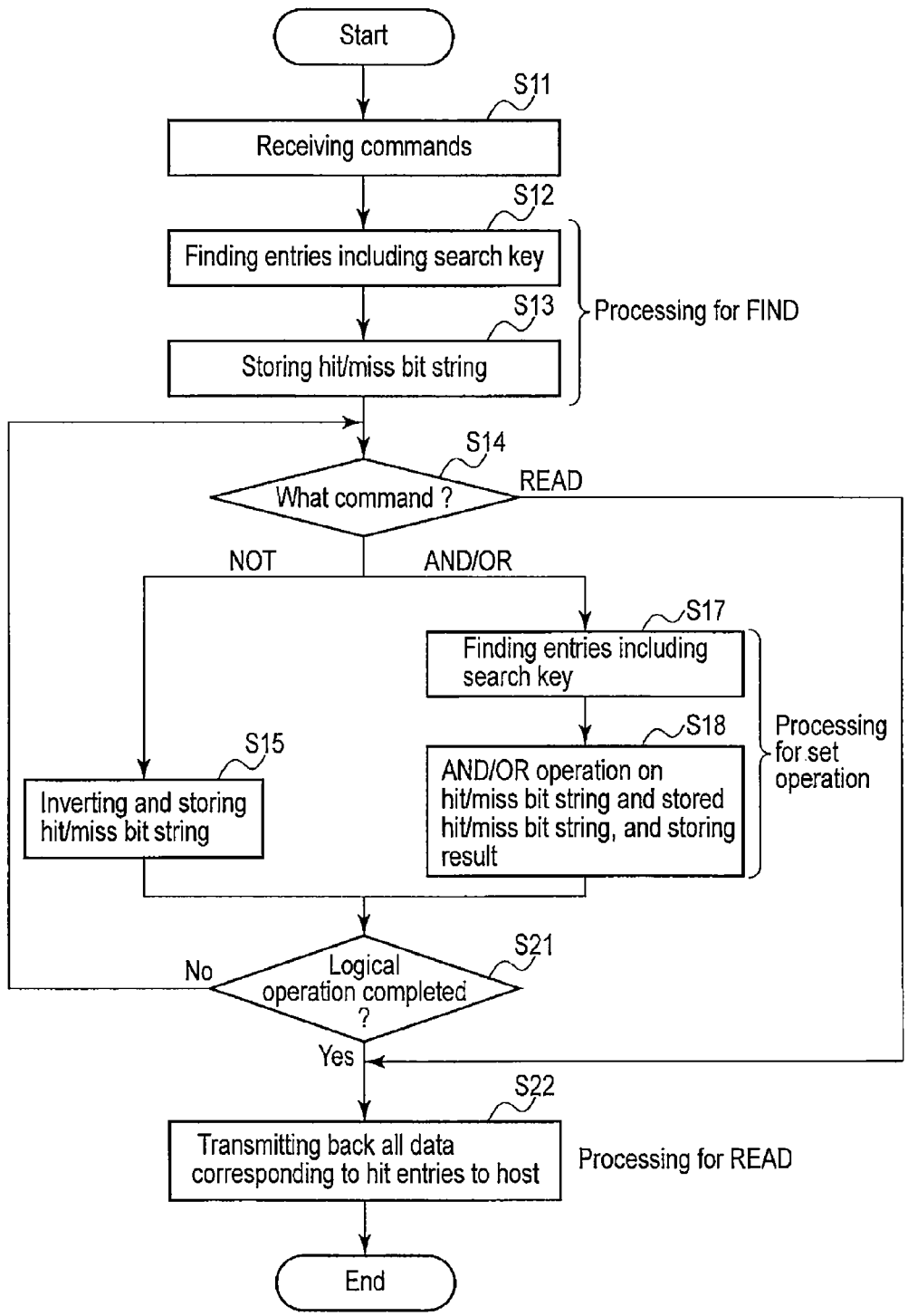
FIG. 7 illustrates a flowchart for the operation of the memory system according to the second embodiment.

A memory system according to the second embodiment has the same configuration as that for the first embodiment except for the configuration of the local controller 12. FIG. 5 illustrates a block diagram of the memory system according to the second embodiment. As shown in FIG. 5, the local controller 12 of the second embodiment includes a logical operation module 61 as well as all modules in the first embodiment. FIG. 6 schematically illustrates an operation of the memory system according to the second embodiment. FIG. 7 schematically illustrates the operation of the memory system according to the second embodiment, and is a flowchart corresponding to FIG. 6. As shown in FIGS. 6 and 7, assume that the host 2 has received a request to search data involving the logical operation to the search keys. Such a request may include, for example, the GET command which requests AND of the key1 and key2, OR of key1 and key2, or NOT of key1. In response to reception of the request, the command generating module 24 breaks it down into the FIND command, the AND command (or the OR or NOT command based on the requested logical operation), and the READ command. FIG. 6 illustrates a case of the AND command. The AND command (and the OR and NOT commands) will be described later. The local controller 12 receives the obtained commands from the host 2 (step S11). Alternatively, the local controller 12 (or command analysis module 31) may receive the GET command involving the logical operation to the search keys, and divide it into the FIND command, one of the AND, OR and NOT commands, and the READ command.

The memory controller 13 (or search module 33) first executes processing similar to that instructed by the FIND command for the search keys. Specifically, the search module 33 instructs the CAM module 17 to generate the hit/miss bit string for the first search key key1. The CAM module 17 performs step S12 to generate the hits/misses bit string 53 for the search key key1. In the second embodiment, the generated hit/miss bit string 53 is stored in the register/buffer 18, and is not output from the memory system 1 (step S13).

The logical operation module 61 (or determination module 35) then identifies the type of subsequent command (step S14). If it is the READ command, the processing shifts to step S22. When the logical operation command is the NOT command, the processing shifts to step S15. In step S15, the logical operation module 61 inverts all bits in the hit/miss bit string 53 to store the thus obtained hit/miss bit string in the register/buffer 18.

If the logical operation command is the AND or OR command, the search module 33 receives the AND or OR command following the FIND command for the search key key1. The AND or OR command specifies the search key key2 as the operand of the AND or OR operation with key1, respectively. Upon reception of the AND or OR command, the CAM module 17 responds to an instruction from the search module 33 to generate the hit/miss bit string 53 for the search key key2 (step S17). Based on the received AND and OR commands, the logical operation module 61 executes the AND or OR operation to the hit/miss bit string 53 for the search key key1 currently stored in the register/buffer 18, and the hit/miss bit string 53 for the key2. The logical operation module 61 updates the hit/miss bit string for the search key key1, which has been stored in the register/buffer 18, with the obtained operation hit/miss bit string (step S18).

It is then determined whether the received logical operation commands have been completed or not (step S21). If all logical operations are not completed, the processing returns to step S14. In contrast, if all logical operations are completed, the memory control module 34 executes the READ command for the operation hit/miss bit string (step S22). Specifically, the memory control module 34 reads from the areas in the file area 41 data corresponding to the addresses in entries specified by the operation hit/miss bit string via the memory controller 13. The read data is transmitted to the host 2 via the local controller 12 and the host interface 11.

Figure 8A:
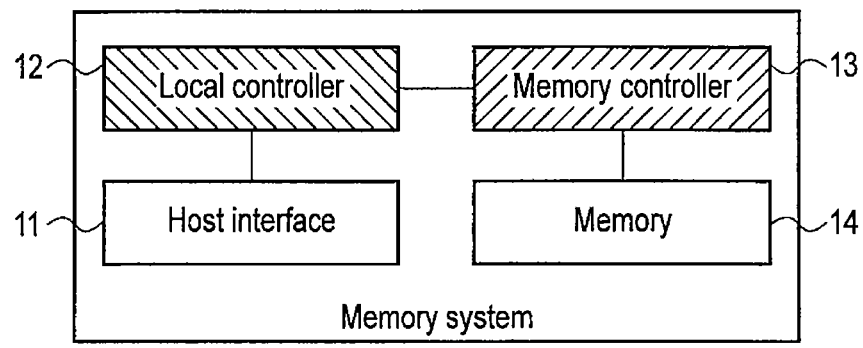
FIGS. 8A and 8B illustrate variations of components which assume specific roles of the memory system according to the second embodiment.
Figure 8B:
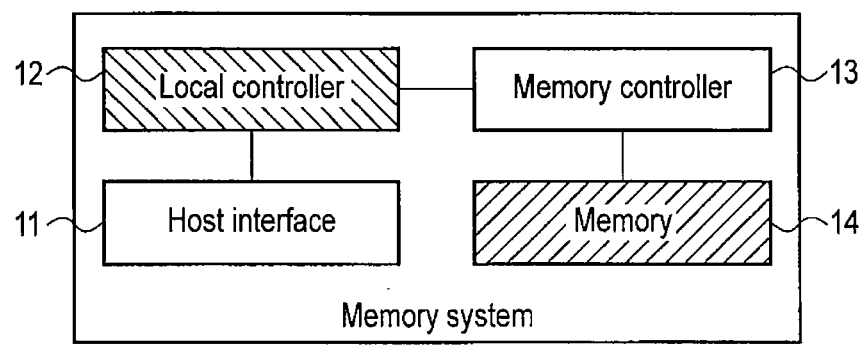

The description so far has covered an example of both the hit/miss bit string and operation hit/miss bit string stored in the register/buffer 18. This corresponds to an example of the memory 14 without the CAM function, i.e., FIG. 8A. A block with diagonally right up hatching generates the hit/miss bit string, and that with diagonally right down hatching generates the operation hit/miss bit string. The FIG. 8A example illustrates that the memory controller 13 (or CAM module 17) generates the hit/miss bit string, and the local controller 12 (or search module 33) generates the operation hit/miss bit string. The CAM module function may be integrated into the register/buffer 18 and implemented as hardware, or the CAM module 17 may be implemented as software. In contrast, for a case of the memory 14 with the CAM function, the hit/miss bit string may be generated by the memory 14, and stored in a page buffer. This corresponds to FIG. 8B. The FIG. 8B example illustrates where the memory 14 follows instructions from the local controller 12 and memory controller 13 to generate the hit/miss bit strings for the search keys, and corresponding operation hit/miss bit strings are generated by the local controller 12, and then stored in the register/buffer 18.

For the remainder of the second embodiment other than the above, all the features for the first embodiment are applied.

As described above, according to the second embodiment, the instruction of data output involving the logical operation to the search keys is executed by the memory system 1 as a search of entries including the search keys, the logical operation of hit/miss bit strings, and output of data corresponding to the operation hit/miss bit string. Such processing is all executed in the memory system 1. With such a method, the data itself including the search keys is not output from the memory system 1, which decreases the amount of transmitted data and allows for efficient data output involving the search keys.

Third Embodiment

The third embodiment concerns parallel execution of commands and is used in addition to the second embodiment. A memory system according to the third embodiment has the same configuration as that for the first and second embodiments except for the configuration of the local controller 12. FIG. 9 illustrates a block diagram of the memory system according to the third embodiment. As shown in FIG. 9, the local controller 12 of the third embodiment includes an identification (ID) identifying module 71 as well as all modules in the second embodiment.

FIG. 10 schematically illustrates an operation of the memory system according to the third embodiment. FIG. 11 schematically illustrates the operation of the memory system according to the third embodiment, and is a flowchart corresponding to FIG. 10. As shown in FIGS. 10 and 11, a command generation module 24 in the host 2 assigns each command the ID. The ID is shown as the parameter (0 or 1, for example) carried by each command at its head in the figures. Particularly, when the GET command which involves the logical operation to the search keys is implemented by the combination of the FIND command, the logical operation command and the READ command as in the first and second embodiments, the common ID is assigned to a series of the commands for execution of the GET command. FIG. 10 illustrates the AND command as the logical operation command as an example. Specifically, the first GET command (ID=0) specifies AND of search keys key1 and key3, and the second GET command (ID=1) specifies AND of search keys key2 and key4.

The command generation module 24 first generates a series of commands for implementing processing for the GET command while assigning them the ID. Specifically, it generates the FIND commands for the search keys key1 and key2 for the Get commands, more specifically the FIND command which specifies ID=0 and key1, and the FIND command which specifies ID=1 and key2. It then generates the AND command which specifies ID=0 and key3, and the AND command which specifies ID=1 and key4. It further generates the READ command which specifies ID=0, and the READ command which specifies ID=1. The host 2 transmits these commands to the memory system 1. The commands can be transmitted in any order so long as for the same ID a FIND command is followed by an AND command, which is in turn followed by a READ command. Thus, a command with an ID can be inserted between commands with another ID so long as the commands with the same ID are transmitted in the fixed order. Therefore, the order of generation of the commands is also not limited to the above example so long as the order of transmission of them is maintained.

The local controller 12 receives the generated commands (step S31). Alternatively, the local controller 12 (or command analysis module 31) may receive the first GET command (key1&key3) and the second GET command (key2&key4) which involve the logical operation to the search keys, and break them down into sets of the FIND command, one of the AND, OR and NOT commands, and the READ command, while specifying their IDs. With this example, the command analysis module 31 may include an ID assignment sub-module.

The ID identifying module 71 identifies the ID of the received command (step S32). The command analysis module 31 then identifies the type of the command for the identified ID (step S33). If the FIND command is received, the CAM module 17 generates the hit/miss bit string 53 for the search key (step S41). For a case of the memory 14 with the CAM function, the memory 14 generates the hit/miss bit string 53. The following description also assumes that the hit/miss bit string 53 may be generated in any of the CAM module 17 and memory 14 in accordance with the application. The obtained hit/miss bit string 53 is stored in the register/buffer 18 in an area for the specified ID (step S42). The register/buffer 18 includes separate areas for respective IDs. Steps S41 and S42 are respectively identical to steps S2 and S13 in the first and second embodiments except for the ID specification.

If the NOT command is received, the logical operation module 61 inverts all bits in the hit/miss bit string 53 currently stored in the register/buffer 18 in the area for the specified ID, and stores the obtained operation hit/miss bit string 53 in the register/buffer 18 in the area for the specified ID (step S44). Steps S43 and S44 are identical to step S15 of in the second embodiment except for the ID specification.

If the AND or OR command is received, the CAM module 17 generates the hit/miss bit string 53 for the search key (step S45). The logical operation module 61 executes the AND or OR operation to the obtained hit/miss bit string 53 and the hit/miss bit string currently stored in the register/buffer 18 in the area for the same ID as that specified by the command in accordance with which of the AND and OR commands has been received. The logical operation module 61 updates the hit/miss bit string previously stored in the register/buffer 18 in the area for the specified ID with the obtained operation hit/miss bit string (step S46). Steps S45 and S46 are respectively identical to step S17 and S18 in the second embodiment except for the ID specification.

If the READ command is received, the memory control module 34 reads data from one or more addresses in the entries specified by the operation hit/miss bit string for the specified ID (step S47). The read data is transmitted to the host 2 via the local controller 12 and host interface 11.

After steps S42, S44, S46, and S47, the determination module 35 determines whether the processing to all commands has been completed (step S51). With an unprocessed command, steps S33, S41 to S47 are performed. In the FIG. 10 example, the FIND, AND, and READ commands are executed for both ID=0 and 1. As a result, the data including both search keys 1 and 3, and data including search keys 2 and 4 is transmitted to the host 2. FIG. 10 illustrates an example of two IDs processed in parallel; however three or more IDs can be processed in accordance with the principle described so far.

As described above, according to the third embodiment the instruction of data output involving the logical operation to the search keys is executed by the memory system 1 as a search of entries including the search keys, the logical operation to the hit/miss bit strings, and output of data corresponding to the operation hit/miss bit string as in the second embodiment. This can provide the same advantage as the second embodiment.

Moreover, commands are identified by their IDs according to the third embodiment. With this, when a data output instruction involving the logical operation to the search keys is instructed by multiple commands like the second embodiment, two or more data outputs involving the logical operation to the search keys can be performed in parallel.

Fourth Embodiment

The fourth embodiment concerns extension of the commands.

FIGS. 12 and 13 illustrate commands supported by a memory system and a host according to the fourth embodiment. Specifically, FIGS. 12 and 13 illustrate parameters and their examples which are specified by a GET command according to the fourth embodiment. As shown in FIG. 12, the GET command includes parameters "key", "key_type", "target", "search_space", "summary_types", "ranking_method", "size", and "buffer". Alternatively, as shown in FIG. 13, it includes parameters "head" and "number" instead of "size" and "buffer".

The parameter "key" is a search key. It may be metadata attached to corresponding data or a file name with its extension. Specifically, it may be specified in a form such as "file.wmv" or "file.txt".

The parameter "key_type" indicates the type of the search key, and specifically it includes character strings such as "text", "image", and "audio" in accordance with the search key being alphabetic data, image data, and audio data, respectively. With the file name used as the parameter "key", the parameter "key_type" specifies "filename".

The parameter "key_type" can also specify "color". In such a case, the parameter "key" may specify "video", "image", "text", "rewritten frequency level" (rewritten frequency levels 1, 2, or 3, . . . ), for example. The value "color" is a value about color information, which indicates information on how frequently data of interest have been rewritten (or information on how frequently the data or file has been updated by a user or the host) and/or type of the data. With memories 14 of multiple types included in the memory system 1, inclusion of the color information in the entries can appropriately determine a memory 14 which will store the data in accordance with the color information. Specifically, when "color" is specified as the parameter "key_type", the memory controller 13 may determine a location which will store the data in accordance with the values "video", "image", and "text" which are set as the parameter key. Specific selection of a storage location will be described later.

The parameter "target" indicates the type of data to be found by the GET command. The determination of the kind of the data may be performed with its file extension. Specifically, the parameter "target" may be "webpage", "file", "doc", "image", "audio", or "video".

The parameter "search_space" specifies the space to be searched by the GET command, and includes character strings such as "web", "disk", and "memory" in accordance with the space to be searched. "Web" specifies a space which can be browsed through the Internet as the space to be searched. "Disk" specifies a disk which can be accessed from a host, such as the memory 14, a hard disk, and a network disk as the space to be searched. It may include specification of a disk to be searched or which directory should be searched in a disk. "Memory" means that an address space including the RAM 22 and memory 14 is specified, and used for the DMA, which will be described later. Specification of the search space adapts the GET command according to the present embodiment to be able to specify an area other than the memory system 1. More specifically, when a component receives the GET command which specifies the parameter "target" as "web", "disk" which specifies an area other than the memory 14, or "memory", it specifies as the search space the web or a memory address space of a disk such as a hard disk coupled to the component or RAM.

The parameter "summary_types" describes a list of types of summary of search results. This parameter is used to allow for attachment of the summary data which briefly describes the found data in order to reduce the time taken by the host to examine or select large-size search results. The parameter "ranking_method" specifies the basis on which the found entries are ranked. Since in general there are multiple found entries, the entries are ranked to allow the host 2 to quickly obtain desired entries. The parameter "size" indicates the size of a buffer in the host 2, which may be allocated in the RAM 22. The parameter "buffer" specifies a selected head address of the buffer in the host 2. The memory system 1 outputs, among all data specified by hit entries, data pieces one after another in descending order of rank specified by the parameter "ranking_method" within the size specified by the parameter "size" to the buffer in the host 2 in an area specified by the parameter "buffer". The data which is not output to the host 2 may be stored in the buffer/register 18 in the memory system 1. Alternatively, only the data output to the host 2 may be read from the memory 14 as needed. When the memory system 1 receives a report of completion of reception of this first portion of the data from the host 2, it outputs the subsequent portion.

The parameter "head" specifies one of the found data pieces ranked in accordance with the standard specified by the parameter "ranking_method". The parameter "number" specifies how many of the found data pieces can be received. The parameters "head" and "number" specify the leading and the number of subsequent ranked found data pieces to specify the data required to be output in contrast to the parameters size and buffer, respectively. For example, using the parameter head=1 and number=10 results in output of the ranked found data pieces from the highest one to the tenth highest one, one after another. Issuing the GET command with head=11 and number=10 results in the data pieces in the 11th to 20th ranks.

FIG. 14 illustrates examples of the parameters of the GET command (FIGS. 12 and 13) according to the fourth embodiment. The second row illustrates a case where the web is searched (search space=web) for images (target=image) associated with "toshiba" (key="toshiba") via text-based search (key_type=text), which specifies a thumbnail image which is a downsized version of an original image as the search result summary (summary_types=[thumbnail]) and specifies the page rank as the standard for ranking the search results (ranking_method=page_rank). The third row illustrates a case where disk area directories below the directory "/home/" (search_space=disk"/home/") are searched for files (target=file) associated with "toshiba" (key="toshiba") via text-based search (key_type=text), which specifies the size and last update time of the file as the search result summary (summary_types=[file_size and modified_date]) and specifies the age of the file as the standard for ranking the found items (ranking_method=new_to_old). The fourth row illustrates an example of use of the search command to implement the DMA transfer which writes or reads data of a certain size from a start address, and which specifies a search of the memory address space (search_space=memory) at address 0x0123abcd or higher (key>=0x0123abcd) (key_type=address) for binary data (target=binary_data), and specifies output of the found items in ascending order of the address (ranking_method=address). The summary is not output (summary_types=null). The DMA transfer will be described along with description on FIGS. 17 and 18 later.

The memory system according to the fourth embodiment has the same configuration as that for the first embodiment except for the configuration of the local controller 12. FIG. 15 illustrates a block diagram of the memory system according to the fourth embodiment. As shown in FIG. 15, the local controller 12 of the fourth embodiment includes a rank calculation module 81 as well as all modules in the first embodiment. The fourth embodiment can be combined with the second and third embodiments. To this end, the local controller 12 of the fourth embodiment may include the logical operation module 61 (FIG. 5) and ID identifying module 71 (FIG. 9).

Figure 16:
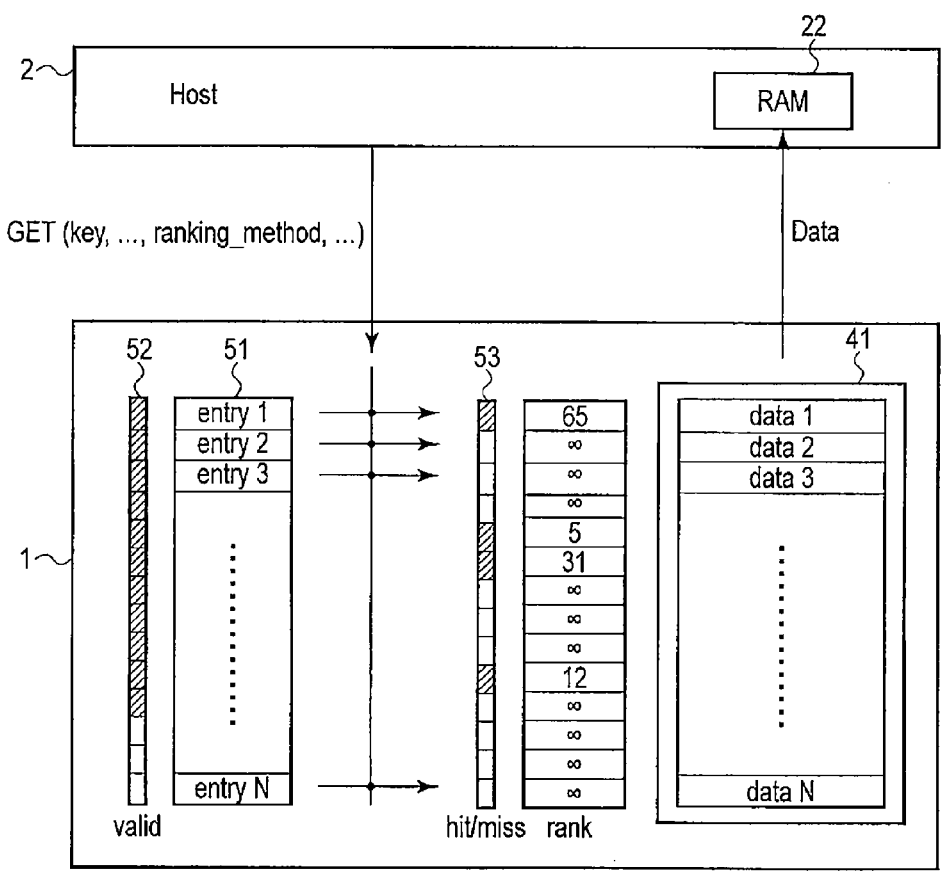

FIG. 16 schematically illustrates an operation of the memory system according to the fourth embodiment. Specifically, FIG. 16 illustrates responses by the memory system 1 to specification of the parameter "ranking_method". As shown in FIG. 16, the CAM module 17, responding to reception of the GET command according to the fourth embodiment, finds one or more valid entries including the search key specified by the parameter "key". The rank calculation module 81 then determines the rank of the hit entries in accordance with the standard specified by the parameter "ranking_method". The local controller 12 then refers to the ranks given to the entries to output to the host 2 the corresponding data items in ascending order of rank.

Figure 18:
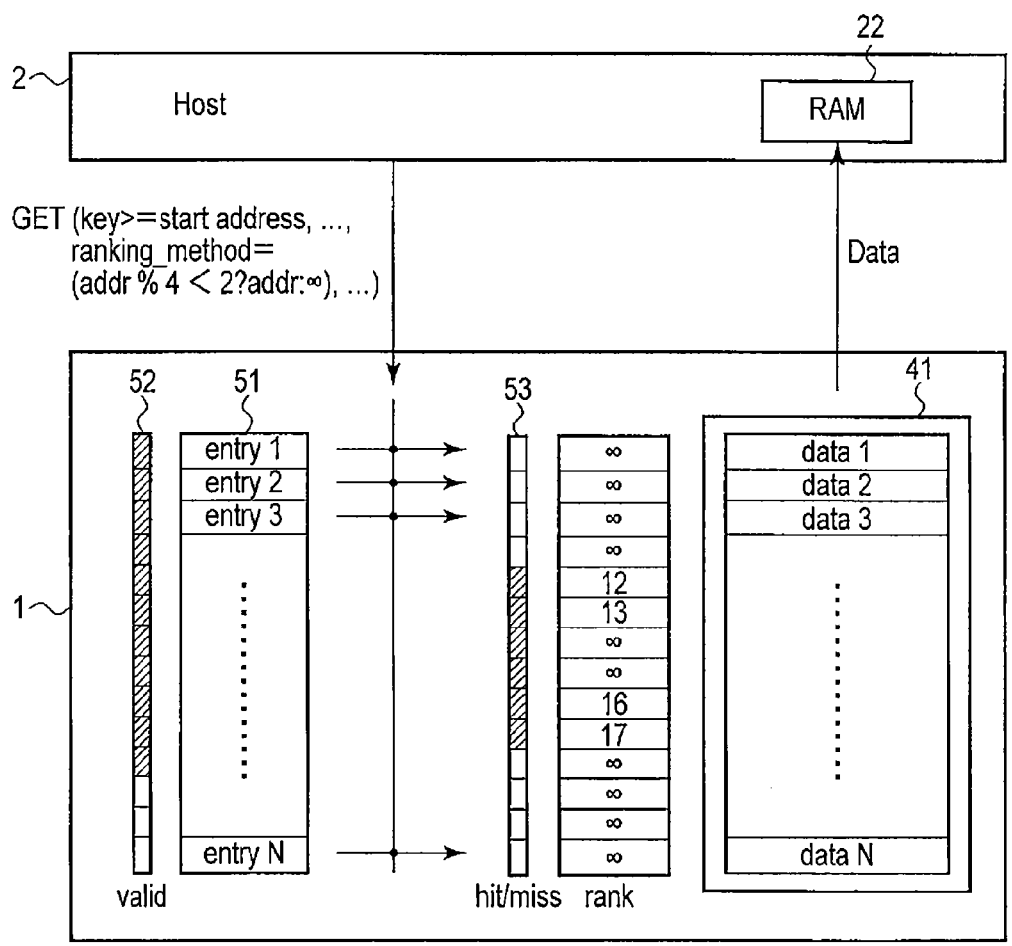

Referring to FIGS. 17 to 19, various example setups of the parameters will now be described. FIGS. 17 to 19 schematically illustrate operations of the memory system according to the fourth embodiment. FIGS. 17 and 18 illustrate that combining appropriate settings of the parameters can realize ordinary data reading, i.e., data reading with a specified address of data to be read and the size thereof, which is equivalent to reading with the DMA transfer, with the GET command. For the data reading by addressing with the GET command, the CAM module 17 is configured to determine not only if there is a full match on whether the entries include the search key but also whether the keys in the entries are greater or less than the search key. An entry also includes the logical address as the parameter "key". Such data storing can be realized with a PUT command, which will be described later, and an entry can include the logical address as a trivial key. The logical address is assigned to data by the host 2. As shown in FIG. 17, in order to read data by addressing with the GET command the host 2 provides the memory system 1 with the GET command which specifies a parameter to specify that the start address and larger addresses are searched as the parameter "key" and specifies "address" as the parameter "ranking_method". The start address here is a logical address. Upon reception of such a GET command, the CAM module 17 finds entries with the search key, i.e., the logical address equal to or greater than the start address. The rank calculation module 81 gives the rank to the hit entries in ascending order of their logical addresses; alternatively, the logical addresses themselves may be ranks. The memory controller 13 then outputs data in accordance with the ranks of the entries. This results in output of the data items in the order of their logical addresses from the data item of the entry including the start address. It is also possible to specify the parameter "key" as "all" (all the entries hit), and the parameter "ranking_method" as "addr<start address?∞:addr", where the notion of "truth value?value1:value2" indicates that value1 is output when the truth value is true and value2 is output when false. In other words, if a logical address is smaller than the specified start address, its rank is infinite, and if it is equal to or greater than the start address, the logical address is the rank. Such parameter specification gives the infinite rank to entries with a logical address smaller than the start address, which substantially inhibits the memory system 1 from outputting the entries. This parameter specification allows for data reading by addressing with the GET command. This in turn allows the memory system 1 to support the DMA function through DMA controller 16.

As shown in FIG. 18, the specification of parameters "ranking_method" of FIG. 17 may be replaced with, for example, "addr % 4<2?addr:∞", where "%" indicates the remainder operation. Such specification assigns ranks to only a limited number of entries with a certain interval among the entries whose logical address is equal to or greater than the start address specified by the parameter "key" as described with reference to FIG. 17. In the example in the figure, the rank is given only to the first two entries in every four. Using such specification can transfer only a specified area in image data, which corresponds to block transfer (BLT).

As shown in FIG. 19, it is possible to execute the similarity-search, which is impossible using the full match or comparison of values. The parameter "key" may be specified as "feature1" and the parameter "ranking_method" may be "distance". "Feature1" is a specific feature vector which describes a feature of image or video data. For a case of a gray scale image, an example of feature1 may be a pixel value histogram. In response to such a GET command, the CAM module 17 finds entries whose keys are similar to the search key. For a case of the parameter "ranking_method" being "distance", all entries are considered as hit, and the rank calculation module 81 gives the rank to the hit entries in accordance with "distance" as described below. The distance can be calculated using the search key, i.e., feature vector, and the feature vector in each entry. Specifically, the calculation can be made based on the difference between the feature vector, which is the search key, and the feature vector in an entry. More specifically, "distance" may be calculated as $(x1-y1)^2+(x2-y2)^2+ \ldots +(xn-yn)^2$. xi and yi (i=1, 2, ..., n) are the i-th component of the feature vector of the search key and that of an entry to be compared, respectively, where n is the number of components in the feature vectors.

The memory controller 13 transmits the data in each entry to the host 2 in accordance with the assigned rank, i.e., in descending order of their similarity to the search key.

FIG. 20 illustrates a command supported by the memory system and host according to the fourth embodiment. Specifically, FIG. 20 illustrates parameters and their examples which are specified by a PUT command according to the fourth embodiment. As shown in FIG. 20, the PUT command includes parameters "key", "key_type", "target", "search_space", "ranking_method", "head", "size", and "buffer". The definitions of the parameters "key", "key_type", "target", and "ranking_method" are the same as those of the GET command. The parameter "search_space" specifies where data will be stored by the same manner as the GET command. Execution of the PUT command is possible by simply adding a key and data in empty entries; however when the memory 14 already includes entries for the key to be added, overwriting them is also possible. In execution of the PUT command, the local controller 12 performs searching using the specified parameters, and then identifies hit entries and assigns ranks to them. The parameter "head" specifies the number of entries between the highest-ranked hit entry and the leading one of the hit entries to be overwritten. With the parameter head=5, the data specified by the fifth and the subsequent hit entries will be updated. Using head=1 results in all entries being overwritten, and using head=∞ will perform no overwriting and will write in empty entries. The parameter "size" specifies the maximum size of the data to be written. The parameter "buffer" specifies the head address of the buffer in the host 2. Data to be written by the PUT command is transferred from the buffer to the host 2. Data writing (updating) by addressing using the thus defined PUT command will now be described with reference to FIG. 21.

Figures 21, 22:
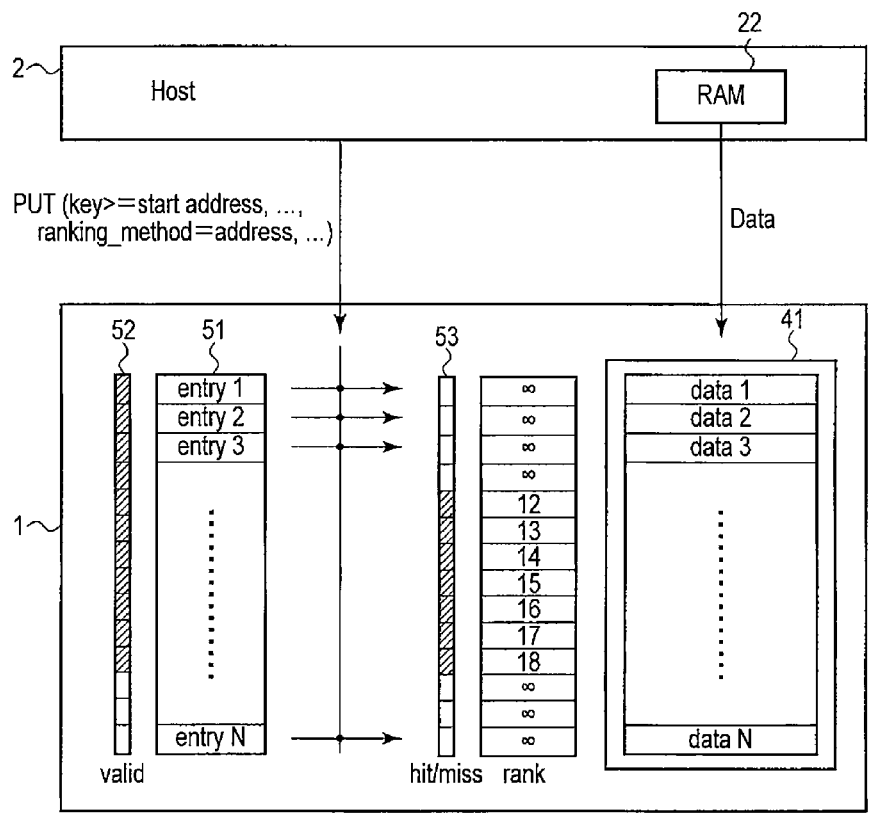
FIG. 21 illustrates an operation of the memory system according to the fourth embodiment.
FIG. 22 illustrates commands supported by the memory system according to the fourth embodiment.

FIG. 21 schematically illustrates an operation of the memory system according to the fourth embodiment. As shown in FIG. 21, the host 2 provides the memory system 1 with a PUT command which specifies key>=the logical address of to-be-updated-data (i.e. its head address) and ranking_method=address. In response to reception of such a PUT command, the CAM module 17 uses the head address as the search key to find entries whose address is equal to or greater than it as with the GET command. The rank calculation module 81 then gives the rank to the hit entries in accordance with the standard specified by the parameter "ranking_method" as with the GET command. In accordance with ranking_method=address, the entries are given their respective ranks based on their logical addresses. Thus, the parameter "head" specifies the number of entries between the highest-rank hit entry and the leading one of the entries to receive data writing. Specifically, with head=1, the data will be overwritten in the file area address described in the head hit entry and in each subsequent entry. The memory control module 34 and memory controller 13 write data in the file area 41 in locations specified by thus-specified entries. In this way, it is possible to use addressing with the PUT command to perform the data writing, i.e., conventional data writing, which is equivalent to the data writing by DMA transfer.

During writing, the data storage location can be determined by the memory controller 13 in accordance with the color information. Nonvolatile memory is generally limited in terms of the number of writes, and different types of memory, such as SLC and MLC, have different limits. The life of the memory system 1 can be improved by storing data expected to be rewritten less frequently in the memory with a small rewriting durability and data expected to be written frequently in the memory with a large rewriting durability. For example, image or video data, which is rewritten less frequently, is stored in the MLC-type NAND flash memory, which has a low rewriting durability but a high storage capacity, and text data, which is rewritten frequently, is stored in the SLC-type NAND flash memory, which has a high rewriting durability. For a case of the file name used as the parameter "key", the color information can be determined from the extension of the file name as well as the value specified with key_type=color. For example, if the name of a file is "file.wmv", the file can be determined to be video data and stored in the MLC-type NAND flash memory, and if it is "file.txt", the file can be determined to be text data and stored in the SLC-type NAND flash memory.

FIG. 22 illustrates a command supported by the memory system and host according to the fourth embodiment. Specifically, FIG. 22 illustrates parameters specified by an ADD_KEY command according to the fourth embodiment. The ADD_KEY command adds a key to an already written entry. The ADD_KEY command includes parameters "key", "key_type", "target", "search_space", "ranking_method", "head", "number", "key_to_add", and "key_to_add_type". The parameters "key", "key_type", "target", "search_space", and "ranking_method" are the same as those of the GET command. The parameter "head" is the same as that of the PUT command. The parameter "number" specifies how many entries are processed from the entry specified by the parameter "head". The parameter "key_to_add" describes the key to be added. The parameter "key_to_add_type" indicates the type of the to-be-added key.

In response to the reception of the ADD_KEY command, the CAM module 17 finds an entry or entries including the search key as with the GET command. The rank calculation module 81 then gives the rank to the hit entries in accordance with the standard specified by the parameter "ranking_method", as with the GET command. The local controller 12 then identifies, among the ranked hit entries, N entries descending from the M-th highest ranked entry, where N is the number of entries specified by the parameter "number" and M is the number of ranks specified by the parameter "head". The memory control module 34 and memory controller 13 then add the key described in the parameter "key_to_add" and the key type described in the parameter "key_to_add_type" to the identified entries. Use of the ADD_KEY command can add a key to the data which already exist in the memory 14, without registering as new entries the data to which only the addition of a key is requested. The entries to receive a new key by the ADD_KEY command may have been written with ordinary keys, as in the first to third embodiments, as well as with addressing described with reference to FIG. 21 as an example of the present embodiment.

As described above, the GET command and PUT command according to the memory system according to the fourth embodiment include various parameters, including the parameter "ranking_method", which provide a means to specify a range to be searched, and give the rank and/or summary to provide a memory system which allows for simplified examination and/or choice of the search results by the host. Using such commands to give entries the head address of one data piece as the parameter "key" and to specify "address" as the parameter "ranking_method" allows for data writing and reading with addressing using the GET or PUT command. In other words, both data writing and reading with the search key specification and that with addressing can be supported with a common command system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory which stores data pieces and search information including entries, each entry being associated with a search key for specifying one data piece and a real address at which the data piece is stored; and
a controller, which, upon reception of a first command which includes a first operand, specifies a search key in the first operand and a key type, and instructs outputting of one data piece corresponding to one entry which includes the search key specified by the first command, outputs one data piece corresponding to one entry, the one entry including the search key specified by the first command, when the first command specifies text as the key type, and
when the first command specifies one logical address as the search key in the first operand and an address as the key type, outputs one data piece corresponding to one entry including a real address and the logical address specified as the search key, wherein the first command is able to specify a parameter which specifies a basis on which found data pieces are ranked, and
the controller outputs data pieces in order based on the specified basis.

2. The device of claim 1, further comprising a DMA controller which outputs the first command which specifies the real address.

3. The device of claim 1, wherein
the search key includes at least one of a word included in one data piece, a file name of one data piece, and an extension of a file name, and rewriting frequency of one data piece.

4. The device of claim 1, wherein
one entry is provided for each of the data pieces and includes a plurality of search keys.

5. A semiconductor memory device comprising:
a memory which stores data pieces and search information including entries, each entry being associated with a search key for specifying one data piece and a real address at which the data piece is stored; and
a controller which upon reception of a first command which specifies a search key and instructs outputting of a string of bits, outputs to outside the semiconductor memory device a string of bits, each one of the bits in the string of bits corresponding to one of the entries and indicating whether the corresponding entry includes the search key specified by the first command, and
upon reception of a second command which specifies a string of bits, outputs one data piece specified in one entry specified by one of the string of bits specified by the second command.

6. The device of claim 5, further comprising a command analyzer which receives a third command for specifying the search key and reading one data piece corresponding to the search key from the memory, and generates the first command and the second command in accordance with the third command.

7. The device of claim 5, wherein
the search key includes at least one of a word included in one data piece, a file name of one data piece, and an extension of a file name, and rewriting frequency of one data piece.

8. The device of claim 5, wherein
one entry is provided for each of the data pieces and includes a plurality of search keys.

9. A semiconductor memory device comprising:
a memory which stores data pieces and search information including entries, each entry being associated with a search key for specifying one data piece and a real address at which the data piece is stored; and
a controller which, upon reception of a first command which specifies a search key and instructs generating of a string of bits, generates a first string of bits, each one of the bits in the first string of bits corresponding to one of the entries and indicating whether the corresponding entry includes the search key specified by the first command, upon reception of a second command which specifies a search key and instructs generating of a string of bits,
generates a second string of bits, each one of the bits in the second string of bits corresponding to one of the entries and indicating whether the corresponding entry includes the search key specified by the second command, and
performs a set operation specified by the second command to the first string of bits and the second string of bits, and outputs the result.

10. The device of claim 9, further comprising
an ID assignment section which, when a plurality of set operation are performed by the first command and the second command, assigns an ID to a set of the first command and the second command for each set operation.

11. The device of claim 9, wherein
the search key includes at least one of a word included in one data piece, a file name of one data piece, and an extension of a file name, and rewriting frequency of one data piece.

12. The device of claim 9, wherein
one entry is provided for each of the data pieces and includes a plurality of search keys.

13. An information processing device comprising:
a host device, and
a semiconductor memory device coupled to the host device, wherein the semiconductor memory device comprises a memory which stores data pieces and search information including entries,
each entry being associated with a search key for specifying one data piece and a real address at which the data piece is stored; and
a controller, which, upon reception of a first command which includes a first operand, specifies a search key in the first operand and a key type and instructs outputting of one data piece corresponding to one entry which includes the search key specified by the first command, outputs one data piece corresponding to one entry, the one entry including the search key specified by the first command, when the first command specifies text as the key type, and when the first command specifies one logical address as the search key in the first operand and an address as the key type, outputs one data piece corresponding to one entry including a real address and the logical address specified as the search key, wherein the first command is able to specify a parameter which specifies a basis on which found data pieces are ranked, and the controller outputs data pieces in order based on the specified basis.

14. The device of claim 13, wherein the semiconductor device further comprises a DMA controller which outputs the first command which specifies the real address.

15. The device of claim 13, wherein
the search key includes at least one of a word included in one data piece, a file name of one data piece, an extension of a file name, and rewriting frequency of one data piece.

16. The device of claim 13, wherein
one entry is provided for each of the data pieces and includes a plurality of search keys.

17. The device of claim 1, wherein
when the first command specifies one logical address as the search key and an address as the basis on which found data pieces are ranked, the controller outputs data pieces associated with found entries in order according to logical addresses included in the found entries.

18. The device of claim 13, wherein
when the first command specifies one logical address as the search key and an address as the basis on which found data pieces are ranked, the controller outputs data pieces associated with found entries in order according to logical addresses included in the found entries.

19. A semiconductor memory device comprising:
a memory which stores data pieces and search information including entries, each entry being associated with a search key for specifying one data piece and a real address at which the data piece is stored; and
a controller, which upon reception of a first command which includes a first operand, specifies a search key in the first operand and a key type and instructs outputting of one data piece corresponding to one entry, the one entry including the search key specified by the first command, outputs one data piece corresponding to one entry which includes the search key specified by the first command when the first command specifies text as the key type, and when the first command specifies one logical address as the search key in the first operand and an address as the key type, outputs one data piece corresponding to one entry including a real address corresponding to the logical address specified as the search key.

* * * * *